(12) United States Patent
Adachi

(10) Patent No.: US 8,649,532 B2
(45) Date of Patent: Feb. 11, 2014

(54) ELECTRONIC VOLUME CIRCUIT

(75) Inventor: Koichiro Adachi, Hyogo (JP)

(73) Assignee: Ricoh Company, Ltd., Tokyo (JP)

(*) Notice: Subject to any disclaimer, the term of this patent is extended or adjusted under 35 U.S.C. 154(b) by 311 days.

(21) Appl. No.: 12/850,990

(22) Filed: Aug. 5, 2010

(65) Prior Publication Data
US 2011/0043279 A1 Feb. 24, 2011

(30) Foreign Application Priority Data

Aug. 18, 2009 (JP) ................. 2009-188929

(51) Int. Cl.
*H03G 3/00* (2006.01)
*H03F 99/00* (2009.01)

(52) U.S. Cl.
USPC ............ 381/104; 381/120; 381/28; 330/254; 330/278

(58) Field of Classification Search
USPC ................. 381/120, 104–109, 123, 1, 27, 28; 330/254, 278, 86, 98–99
See application file for complete search history.

(56) References Cited

U.S. PATENT DOCUMENTS

| 4,479,250 | A | * | 10/1984 | Flood | 455/213 |
| 4,686,686 | A | * | 8/1987 | Nakayama et al. | 375/229 |
| 6,452,443 | B1 | * | 9/2002 | Thompson et al. | 327/553 |
| 8,084,679 | B2 | * | 12/2011 | Arnold | 84/735 |

FOREIGN PATENT DOCUMENTS

| JP | 7-254830 | 10/1995 |
| JP | 2007-267016 | 10/2007 |
| JP | 2009-105635 | 5/2009 |
| JP | 2010-21775 | 1/2010 |

* cited by examiner

*Primary Examiner* — Xu Mei
(74) *Attorney, Agent, or Firm* — Cooper & Dunham LLP

(57) ABSTRACT

An electronic volume circuit includes a first signal processing circuit and a second signal processing circuit that are cascaded together. The first signal processing circuit includes a first operational amplifier including an input terminal and an output terminal, one or more input resistors inputting one or more signals to the input terminal of the first operational amplifier, and a feedback resistor connected between the input terminal and the output terminal of the first operational amplifier. The second signal processing circuit includes a second operational amplifier including an input terminal and an output terminal, an input capacitor inputting a signal output from the first operational amplifier to the input terminal of the second operational amplifier, and a resistor and a capacitor connected in parallel between the input terminal and the output terminal of the second operational amplifier.

11 Claims, 4 Drawing Sheets

ELECTRONIC VOLUME CIRCUIT

BACKGROUND OF THE INVENTION

1. Field of the Invention

A certain aspect of the present invention relates to an electronic volume circuit.

2. Description of the Related Art

Patent Application Publication No. 7-254830 discloses an electronic volume circuit including an operational amplifier. Although the electronic volume circuit disclosed in Patent Application Publication No. 7-254830 does not have a multi-channel mixing function, recent electronic volume circuits (such as a line-out amplifier and a headphone amplifier) are expected to have a high signal-to-noise ratio and low distortion characteristic as well as to include various functions such as a multi-channel mixing function, a multi-step electronic volume function, and a function to generate an output signal that is based on ground potential (this in turn makes it possible to reduce the number of external parts).

FIG. 4 is a circuit diagram of a related-art electronic volume circuit. The electronic volume circuit of FIG. 4 includes a controller 50; input terminals T1 and T2 for inputting input signals Si1 and Si2 that are audio signals; a variable capacitor 53 used as an input capacitor; a switch 51 connected between the input terminal T1 and the variable capacitor 53; a variable capacitor 54 used as an input capacitor; a switch 52 connected between the input terminal T2 and the variable capacitor 54; an operational amplifier 57; a capacitor 55 and a resistor 56 connected in parallel between the inverting input terminal and the output terminal of the operational amplifier 57; an output terminal T3 for outputting an output signal Sout from the operational amplifier 57; and a load resistor 9. One electrode of the variable capacitor 53 is connected via the switch 51 to the input terminal T1 and the other electrode of the variable capacitor 53 is connected to the inverting input terminal of the operational amplifier 57. Similarly, one electrode of the variable capacitor 54 is connected via the switch 52 to the input terminal T2 and the other electrode of the variable capacitor 54 is connected to the inverting input terminal of the operational amplifier 57. The non-inverting input terminal of the operational amplifier 57 is grounded; the inverting input terminal and the non-inverting input terminal are virtually short-circuited; and the output terminal is grounded via the load resistor 9. The capacitor 55 is a feedback capacitor and the resistor 56 is a feedback resistor.

As shown in FIG. 4, the controller 50 outputs pass control signals to the switches 51 and 52 to turn on at least one of the switches 51 and 52. The controller 50 also outputs volume control signals to the variable capacitors 53 and 54 to set the capacitance values of the variable capacitors 53 and 54 at specific values. Thus, the electronic volume circuit of FIG. 4 is configured to mix and variably amplify or attenuate the input signals Si1 and Si2 that are based on a predetermined reference voltage level and thereby to output the output signal Sout that is based on ground potential.

The resistor 56 and the capacitor 55 constitute a high-pass filter; and the variable capacitors 53 and 54 and the switches 51 and 52 having on-resistances constitute a low-pass filter. The cut-off frequency of the high-pass filter is set at a value such that the output signal Sout with a predetermined level is output at 20 Hz that is the lower limit of the audio signal band. Here, depending on the resistance value of the resistor 56, the signal-to-noise ratio may become low because of the thermal noise generated by the resistor 56. Therefore, for example, the resistance value of the resistor 56 is set at several hundred MΩ and the capacitance value of the capacitor 55 is set at several tens pF. The capacitance values of the variable capacitors 53 and 54 are determined based on the capacitance value of the capacitor 55 and the gain required for the electronic volume circuit.

Since the on-resistances of the switches 51 and 52 are comparatively low, the pole of the low-pass filter is sufficiently higher than 20 kHz that is the upper limit of the audio signal band. When it is necessary to set the pole of the low-pass filter in a lower band, resistors are added before and after the switches 51 and 52 in the electronic volume circuit.

With the configuration of the related-art electronic volume circuit shown in FIG. 4, the sizes of the variable capacitors 53 and 54 necessary when amplifying the input signals Si1 and Si2 are greater than those necessary when attenuating the input signals Si1 and Si2. Also with the configuration of the related-art electronic volume circuit, increasing the number of input signals makes it necessary to increase the number of variable capacitors according to the number of input signals and thereby makes it necessary to increase the die size of a semiconductor integrated circuit including the electronic volume circuit.

SUMMARY OF THE INVENTION

According to an aspect of the present invention, an electronic volume circuit includes a first signal processing circuit and a second signal processing circuit that are cascaded together. The first signal processing circuit includes a first operational amplifier including an input terminal and an output terminal, one or more input resistors inputting one or more signals to the input terminal of the first operational amplifier, and a feedback resistor connected between the input terminal and the output terminal of the first operational amplifier. The second signal processing circuit includes a second operational amplifier including an input terminal and an output terminal, an input capacitor inputting a signal output from the first operational amplifier to the input terminal of the second operational amplifier, and a resistor and a capacitor connected in parallel between the input terminal and the output terminal of the second operational amplifier.

DESCRIPTION OF THE PREFERRED EMBODIMENTS

Preferred embodiments of the present invention are described below with reference to the accompanying drawings. Throughout the accompanying drawings, the same reference numbers are used for the same components.

<First Embodiment>

Figure 1:
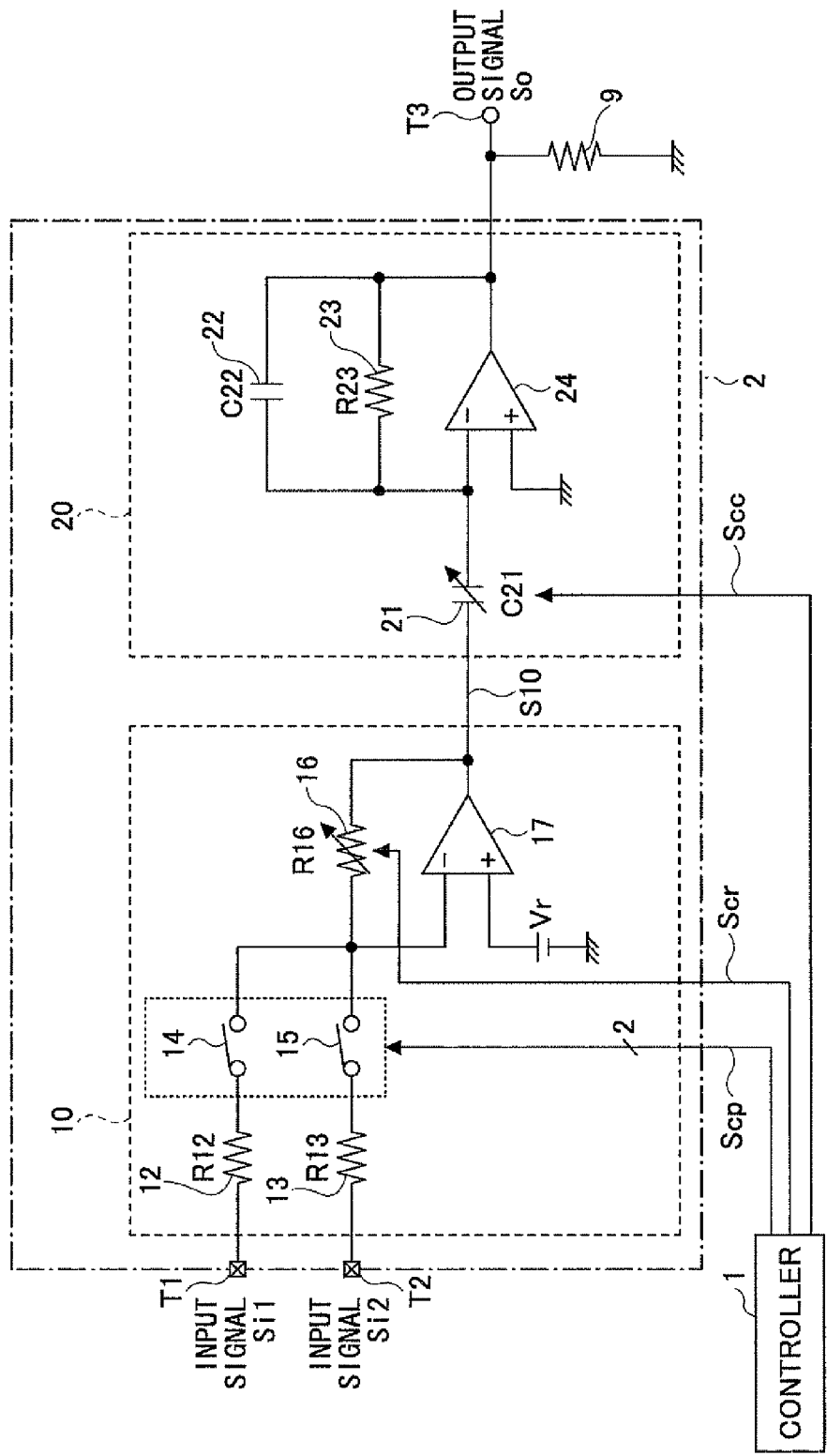
FIG. 1 is a circuit diagram of a semiconductor integrated circuit including an electronic volume circuit 2 according to a first embodiment of the present invention.

FIG. 1 is a circuit diagram of a semiconductor integrated circuit including an electronic volume circuit 2 according to a first embodiment of the present invention. The semiconductor integrated circuit shown in FIG. 1 includes a controller 1 implemented by a logic circuit, input terminals T1 and T2 for inputting input signals Si1 and Si2 that are audio signals, an electronic volume circuit 2, an output terminal T3, and a load resistor 9. The electronic volume circuit 2 includes a multi-channel-mixing-and-volume-control circuit 10 and a volume attenuating circuit 20 that are cascaded together. The multi-channel-mixing-and-volume-control circuit 10 is a first signal processing circuit and the volume attenuating circuit 20 is a second signal processing circuit.

The multi-channel-mixing-and-volume-control circuit 10 includes an input resistor 12 having a resistance value R12; an input resistor 13 having a resistance value R13; switches 14 and 15 that are turned on and off by pass control signals Scp from the controller 1; an operational amplifier 17; and a variable feedback resistor 16 a resistance value R16 of which is varied by a volume control signal Scr from the controller 1. The input signal Si1 is input via the input resistor 12 and the switch 14 to the inverting input terminal of the operational amplifier 17. Meanwhile, the input signal Si2 is input via the input resistor 13 and the switch 15 to the inverting input terminal of the operational amplifier 17. The variable feedback resistor 16 is connected between the inverting input terminal and the output terminal of the operational amplifier 17. The non-inverting input terminal of the operational amplifier 17 is connected to a direct voltage source that outputs a reference potential Vr. The inverting input terminal and the non-inverting input terminal are virtually short-circuited.

The volume attenuating circuit 20 includes a variable capacitor 21 that is an input capacitor a capacitance value C21 of which is varied by a volume control signal Scc from the controller 1; an operational amplifier 24; and a capacitor 22 and a resistor 23 that are connected in parallel between the inverting input terminal and the output terminal of the operational amplifier 24. One electrode of the variable capacitor 21 is connected to the output terminal of the operational amplifier 17 and the other electrode of the variable capacitor 21 is connected to the inverting input terminal of the operational amplifier 24. The non-inverting input terminal of the operational amplifier 24 is grounded, and the inverting input terminal and the non-inverting input terminal of the operational amplifier 24 are virtually short-circuited. The output terminal of the operational amplifier 24 is connected to the output terminal T3 and is grounded via the load resistor 9.

The controller 1 generates, according to control signals from the outside of the semiconductor integrated circuit of FIG. 1, the pass control signals Scp for turning on and off the switches 14 and 15, the volume control signal Scr for varying the resistance value R16 of the variable feedback resistor 16, and the volume control signal Scc for varying the capacitance value C21 of the variable capacitor 21.

With the above configuration, when the switches 14 and 15 are turned on, the operational amplifier 17 inverts and adds a signal obtained by multiplying the input signal Si1 by R16/R12 and a signal obtained by multiplying the input signal Si2 by R16/R13 and outputs a resulting signal S10 to the volume attenuating circuit 20. The output signal S10 is based on the reference potential Vr. The operational amplifier 24 outputs a signal So that is based on ground potential and is obtained by multiplying the output signal S10 from the multi-channel-mixing-and-volume-control circuit 10 by C21/C22. Here, it is assumed that f>>fc, where f is the signal frequency and fc=1/(2πR23·C22) is the cut-off frequency. C21 is the capacitance value of the variable capacitor 21, C22 is the capacitance value of the capacitor 22, and C21 is less than C22.

In the electronic volume circuit 2 of this embodiment, the multi-channel-mixing-and-volume-control circuit 10 inverts and adds a signal obtained by variably amplifying or attenuating the input signal Si1 and a signal obtained by variably amplifying or attenuating the input signal Si2, and outputs the resulting signal S10 to the volume attenuating circuit 20. Then, the volume attenuating circuit 20 variably attenuates the output signal S10 that is based on the reference potential Vr and thereby generates the output signal So. Thus, the volume attenuating circuit 20 converts the output signal S10 that is based on the reference potential Vr into the output signal So that is based on ground potential.

Figure 4:
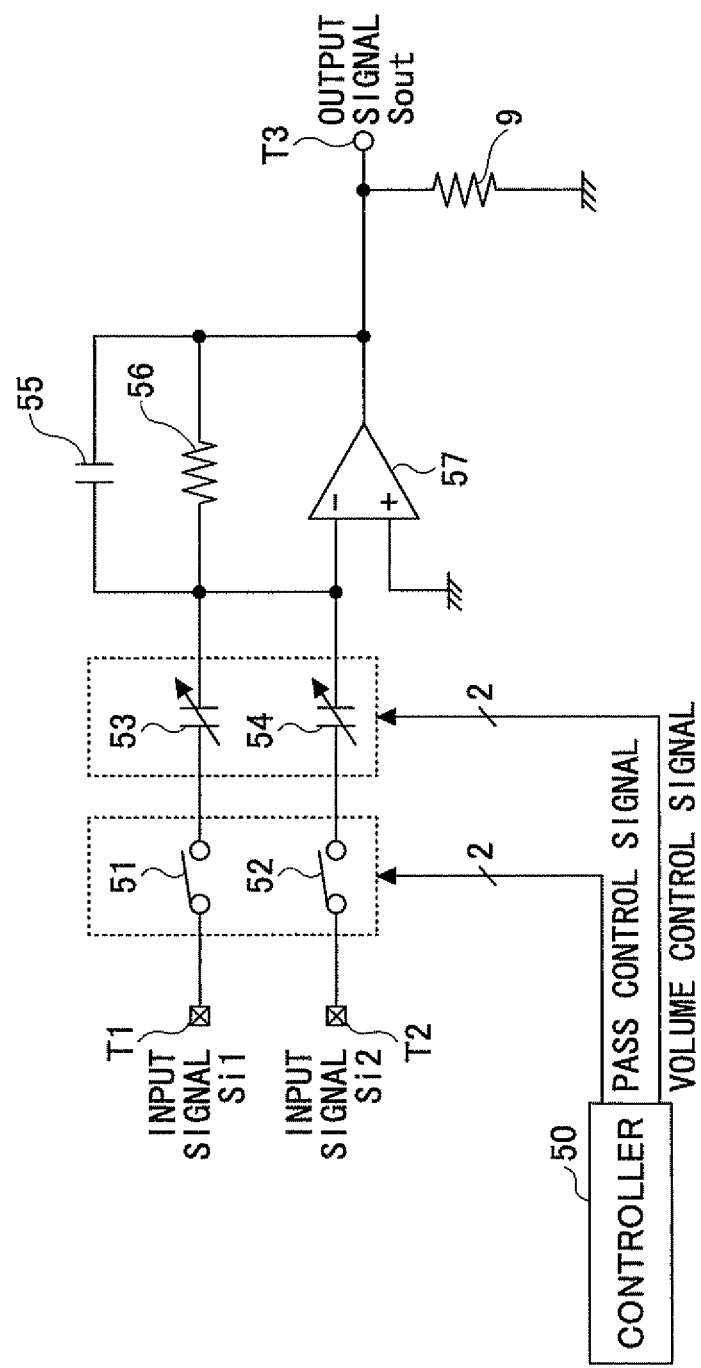
FIG. 4 is a circuit diagram of a related-art electronic volume circuit.

While the related-art electronic volume circuit of FIG. 4 includes only one stage, the electronic volume circuit 2 of this embodiment includes two stages (the multi-channel-mixing-and-volume-control circuit 10 and the volume attenuating circuit 20). However, the multi-channel-mixing-and-volume-control circuit 10 (first stage) includes only the input resistors 12 and 13, the switches 14 and 15, the variable feedback resistor 16, and the operational amplifier 17, and therefore occupies a comparatively small area. Also, since the volume attenuating circuit 20 (second stage) is configured to attenuate one output signal S10, it needs only one variable capacitor 21. Thus, unlike the related-art configuration, the configuration of the electronic volume circuit 2 of this embodiment requires only one variable capacitor regardless of the number of input signals. This in turn makes it possible to reduce the die size of the semiconductor integrated circuit including the electronic volume circuit 2. Also, since the volume attenuating circuit 20 includes only the attenuating function, unlike the related-art configuration, it is not necessary to provide a capacitor for the amplifying function.

<Second Embodiment>

Figure 2:
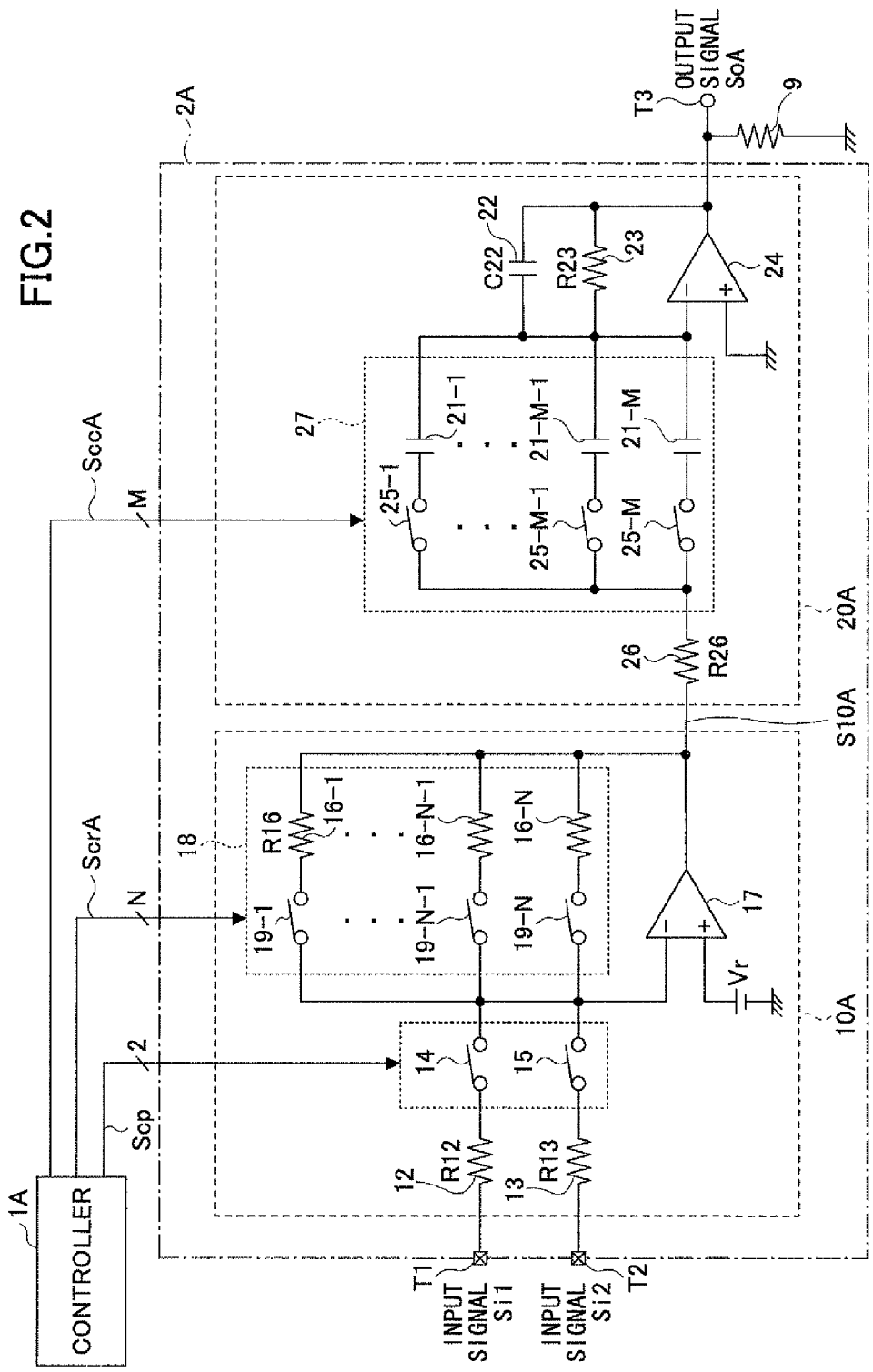
FIG. 2 is a circuit diagram of a semiconductor integrated circuit including an electronic volume circuit 2A according to a second embodiment of the present invention.

FIG. 2 is a circuit diagram of a semiconductor integrated circuit including an electronic volume circuit 2A according to a second embodiment of the present invention. The electronic volume circuit 2A is different from the electronic volume circuit 2 of the first embodiment in that the variable resistor 16 is replaced with a resistance value switching circuit (value-variable circuit) 18, the variable capacitor 21 is replaced with a capacitance value switching circuit (value-variable circuit) 27, and a high-frequency-cutting input resistor 26 for cutting off a signal in a frequency band higher than the audio frequency band is added.

The semiconductor integrated circuit shown in FIG. 2 includes a controller 1A implemented by a logic circuit, input terminals T1 and T2 for inputting input signals Si1 and Si2 that are audio signals, an electronic volume circuit 2A, an output terminal T3, and a load resistor 9. The electronic volume circuit 2A includes a multi-channel-mixing-and-volume-control circuit 10A and a volume attenuating circuit 20A that are cascaded together. The multi-channel-mixing-and-volume-control circuit 10A is a first signal processing circuit and the volume attenuating circuit 20A is a second signal processing circuit.

The multi-channel-mixing-and-volume-control circuit 10A includes input resistors 12 and 13; switches 14 and 15 that are turned on and off by pass control signals Scp from the controller 1A; an operational amplifier 17; and the resistance value switching circuit 18. The input signal Si1 is input via the input resistor 12 and the switch 14 to the inverting input terminal of the operational amplifier 17. Meanwhile, the input signal Si2 is input via the input resistor 13 and the switch 15 to the inverting input terminal of the operational amplifier 17. The resistance value switching circuit 18 is connected between the inverting input terminal and the output terminal of the operational amplifier 17. The non-inverting input terminal of the operational amplifier 17 is connected to a direct voltage source that outputs a reference potential Vr. The inverting input terminal and the non-inverting input terminal are virtually short-circuited.

The resistance value switching circuit 18 includes N switches 19-1, 19-2, ..., and 19-N; and N feedback resistors 16-1, 16-2, ..., and 16-N connected in series to the corresponding switches 19-1, 19-2, ..., and 19-N. Each pair of a switch 19-n (n=1, 2, ..., N) and a feedback resistor 16-n (n=1, 2, ..., N) constitutes a series circuit, and multiple series circuits are connected in parallel between the inverting input terminal and the output terminal of the operational amplifier 17. The feedback resistors 16-1 through 16-N have the same resistance value R16.

The volume attenuating circuit 20A includes the high-frequency-cutting input resistor 26 for cutting off a signal in a frequency band higher than the audio frequency band; the capacitance value switching circuit 27; an operational amplifier 24; and a capacitor 22 and a resistor 23 that are connected in parallel between the inverting input terminal and the output terminal of the operational amplifier 24. An output signal S10A from the multi-channel-mixing-and-volume-control circuit 10A is input via the input resistor 26 to the capacitance value switching circuit 27. The non-inverting input terminal of the operational amplifier 24 is grounded, and the inverting input terminal and the non-inverting input terminal of the operational amplifier 24 are virtually short-circuited. The output terminal of the operational amplifier 24 is connected to the output terminal T3 and is grounded via the load resistor 9.

The capacitance value switching circuit 27 includes M switches 25-1, 25-2, ..., and 25-M; and M capacitors 21-1, 21-2, ..., and 21-M having different capacitance values and connected in series to the corresponding switches 25-1, 25-2, ..., and 25-N. Each pair of a switch 25-m (m=1, 2, ..., M) and a capacitor 21-m (n=1, 2, ..., M) constitutes a series circuit, and multiple series circuits are connected in parallel between the input resistor 26 and the inverting input terminal of the operational amplifier 24. The capacitance values of the capacitors 21-1 through 21-M are less than the capacitance value C22 of the capacitor 22 and therefore the volume attenuating circuit 20A attenuates but does not amplify the signal S10A.

The controller 1A outputs volume control signals ScrA to the switches 19-1 through 19-N to turn on at least one of the switches 19-1 through 19-N. As a result, a combined resistance value R16A of the feedback resistor (the resistance value switching circuit 18) connected to the operational amplifier 17 becomes one of R16, R16/2, ..., and R16/N. The controller 1A also outputs a volume control signal SccA to one of the switches 25-1 through 25-M to turn it on. As a result, a capacitance value C21A of the capacitor (the capacitance value switching circuit 27) connected between the inverting input terminal of the operational amplifier 24 and the input resistor 26 becomes the capacitance value of one of the capacitors 25-1 through 25-M.

With the above configuration, when the switches 14 and 15 are turned on, the operational amplifier 17 inverts and adds a signal obtained by multiplying the input signal Si1 by R16A/R12 and a signal obtained by multiplying the input signal Si2 by R16A/R13, and outputs the resulting signal S10A to the volume attenuating circuit 20A. The output signal S10A is based on the reference potential Vr. The operational amplifier 24 outputs a signal SoA that is based on ground potential and is obtained by multiplying the output signal S10A from the multi-channel-mixing-and-volume-control circuit 10A by C21A/C22. Here, it is assumed that f>>fc, where f is the signal frequency and fc=1/(2πR23·C22) is the cut-off frequency).

In the volume attenuating circuit 20A, the input resistor 26, the on-resistances of the switches 25-1 through 25-M, and the capacitors 21-1 through 21-M constitute a low-pass filter that attenuates noise in a frequency band higher than the audio frequency band. Meanwhile, the capacitor 22 and the resistor 23 constitute a high-pass filter. This configuration makes it possible to output the signal SoA that is based on ground potential. The characteristics of the low-pass filter and the high-pass filter are determined such that a signal in the audio frequency band between 20 Hz and 20 kHz is passed.

The electronic volume circuit 2A of the second embodiment provides substantially the same functions and advantages as those of the electronic volume circuit 2 of the first embodiment.

In this embodiment, the resistors 16-1 through 16-N have the same resistance value R16. Alternatively, the resistors 16-1 through 16-N may have different resistance values. In this case, the controller 1A outputs a signal to turn on one of the switches 19-1 through 19-N. Also in this embodiment, the capacitors 21-1 through 21-M have different capacitance values and the controller 1A turns on one of the switches 25-1 through 25-M to select one of the capacitors 21-1 through 21-M. Alternatively, the capacitors 21-1 through 21-M may have the same capacitance value and the controller 1A may be configured to turn on one or more of the switches 25-1 through 25-M to select one or more of the capacitors 21-1 through 21-M.

<Third Embodiment>

Figure 3:
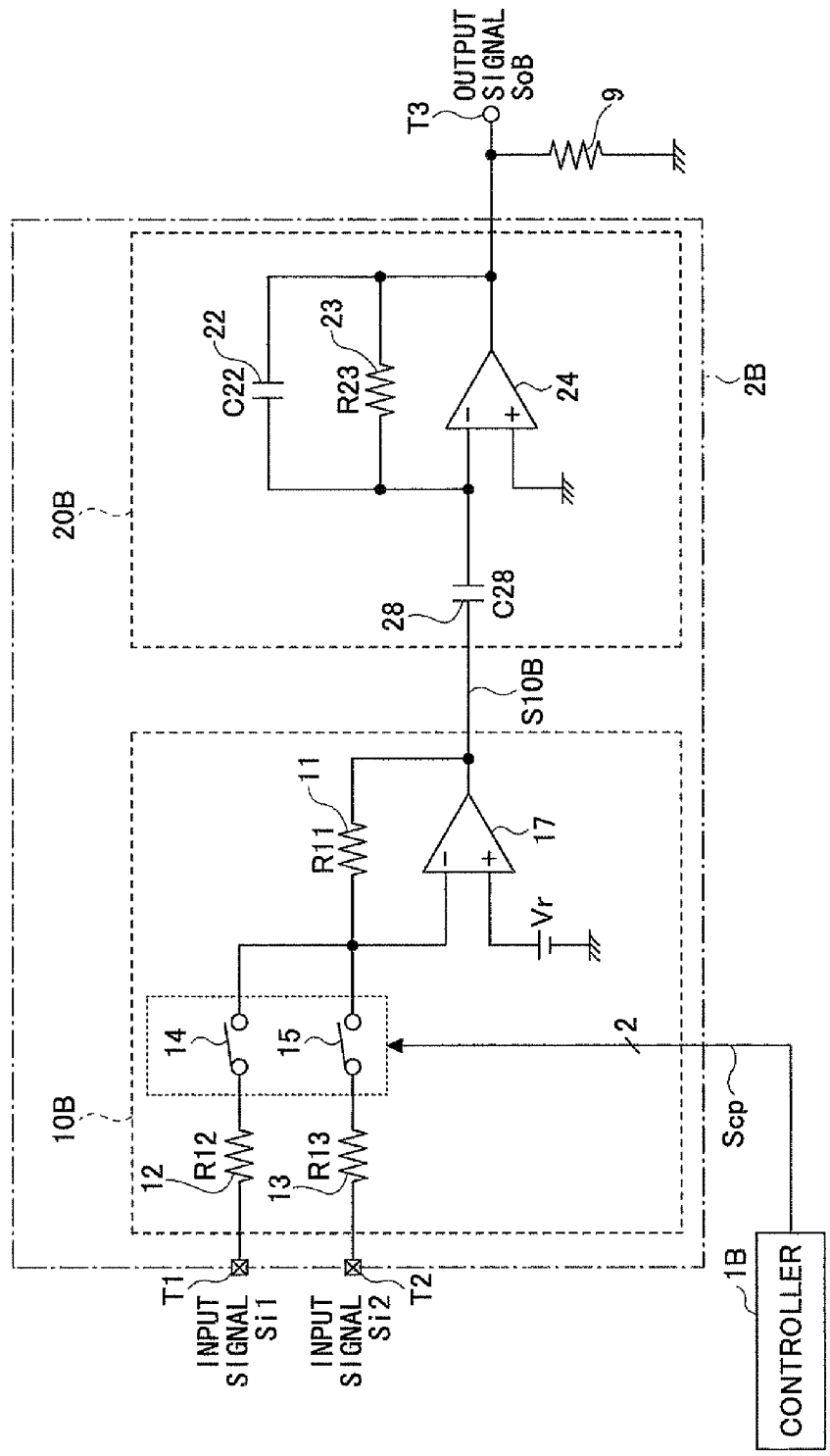
FIG. 3 is a circuit diagram of a semiconductor integrated circuit including an electronic volume circuit 2B according to a third embodiment of the present invention.

FIG. 3 is a circuit diagram of a semiconductor integrated circuit including an electronic volume circuit 2B according to a third embodiment of the present invention. The electronic volume circuit 2B of the third embodiment is different from the electronic volume circuit 2 of the first embodiment in that the variable resistor 16 is replaced with a resistor 11 having a fixed resistance value R11 and the variable capacitor 21 is replaced with a capacitor 28 having a fixed capacitance value C28.

As shown in FIG. 3, the electronic volume circuit 2B includes a multi-channel-mixing-and-volume-control circuit 10B and a volume attenuating circuit 20B that are cascaded together. The multi-channel-mixing-and-volume-control circuit 10B is a first signal processing circuit and has a configuration similar to that of the multi-channel-mixing-and-volume-control circuit 10 except that the variable resistor 16 is replaced with the resistor 11. The volume attenuating circuit 20B is a second signal processing circuit and has a configuration similar to that of the volume attenuating circuit 20 except that the variable capacitor 21 is replaced with the capacitor 28. A controller 1B generates, according to control signals from the outside of the semiconductor integrated circuit of FIG. 3, pass control signals Scp for turning on and off the switches 14 and 15 and outputs the pass control signals Scp to the switches 14 and 15.

With the this configuration, when the switches 14 and 15 are turned on, the operational amplifier 17 inverts and adds a signal obtained by multiplying the input signal Si1 by R11/R12 and a signal obtained by multiplying the input signal Si2 by R11/R13 and outputs a resulting signal S10B to the volume attenuating circuit 20B. The operational amplifier 24 outputs a signal SoB that is based on ground potential and obtained by multiplying the output signal S10B from the multi-channel-mixing-and-volume-control circuit 10B by C28/C22. Thus, different from the electronic volume circuit 2 of the first embodiment, the electronic volume circuit 2B of the third embodiment amplifies the input signals Si1 and Si2 by fixed amplification factors, inverts and adds the amplified signals, and attenuates the resulting signal by a fixed attenuation factor.

Thus, unlike the related-art configuration, the configuration of the electronic volume circuit 2B of this embodiment requires only one capacitor (excluding the capacitor 22) regardless of the number of input signals. This in turn makes it possible to reduce the die size of the semiconductor integrated circuit including the electronic volume circuit 2B.

In the above embodiments, the electronic volume circuits 2, 2A, and 2B are configured to receive two input signals Si1 and Si2. Alternatively, the electronic volume circuits 2, 2A, and 2B may be configured to receive one or more input signals.

As a variation of the first embodiment, one of the variable feedback resistor 16 and the variable capacitor 21 may be replaced with an element having a fixed element value. Also, as a variation of the second embodiment, one of the resistance value switching circuit 18 and the capacitance value switching circuit 27 may be replaced with an element having a fixed element value.

As described above, embodiments of the present invention make it possible to reduce the number of variable capacitors of an electronic volume circuit and thereby make it possible to reduce the die size of a semiconductor device including the electronic volume circuit.

The present invention is not limited to the specifically disclosed embodiments, and variations and modifications may be made without departing from the scope of the present invention.

The present application is based on Japanese Priority Application No. 2009-188929, filed on Aug. 18, 2009, the entire contents of which are hereby incorporated herein by reference.

What is claimed is:

1. An electronic volume circuit, comprising:
a first signal processing circuit and a second signal processing circuit that are cascaded together,
wherein the first signal processing circuit is a multi-channel mixing circuit including
a first operational amplifier including an inverting input terminal, a non-inverting input terminal and an output terminal,
plural input resistors inputting one or more signals to the inverting input terminal of the first operational amplifier, and
a feedback resistor connected between the inverting input terminal and the output terminal of the first operational amplifier, and
wherein the first operational amplifier of the multi-channel mixing circuit is configured to receive, and add, multiple signals input, via the input resistors of the multi-channel mixing circuit, through the inverting input terminal of the first operational amplifier, and
wherein the second signal processing circuit includes
a second operational amplifier including an inverting input terminal, a non-inverting input terminal and an output terminal,
an input capacitor inputting a signal output from the first operational amplifier to the inverting input terminal of the second operational amplifier, with the non-inverting input terminal connected to a ground source, and
a resistor and a capacitor connected in parallel between the inverting input terminal and the output terminal of the second operational amplifier.

2. The electronic volume circuit as claimed in claim 1, wherein at least one of the feedback resistor and the input capacitor is a value-variable circuit an element value of which is variable.

3. The electronic volume circuit as claimed in claim 2, wherein
the feedback resistor is the value-variable circuit and includes first switches and resistors connected in series to the corresponding first switches, pairs of the first switches and the resistors forming first series circuits that are connected in parallel; and
a resistance value of the feedback resistor is variable by turning on and off the first switches.

4. The electronic volume circuit as claimed in claim 2, wherein
the input capacitor is the value-variable circuit and includes second switches and capacitors connected in series to the corresponding second switches, pairs of the second switches and the capacitors forming second series circuits that are connected in parallel; and
a capacitance value of the input capacitor is variable by turning on and off the second switches.

5. The electronic volume circuit as claimed in claim 2, further comprising: a controller varying the element value of at least one of the feedback resistor and the input capacitor.

6. The electronic volume circuit as claimed in claim 1, wherein the second signal processing circuit further includes a high-frequency-cutting input resistor connected between the output terminal of the first operating amplifier and the input capacitor.

7. The electronic volume circuit as claimed in claim 1, wherein the second signal processing circuit is an attenuating circuit.

8. The electronic volume circuit as claimed in claim 1, wherein a capacitance value of the input capacitor is less than a capacitance value of the capacitor.

9. The electronic volume circuit as claimed in claim 1, further comprising plural input terminals to receive respective input signals supplied to the electronic volume circuit, wherein the multi-channel mixing circuit further includes plural switches coupled between the first operational amplifier and the input terminals for inputting the plural input signals, and the plural input signals are selectively input by the switches to the first operational amplifier.

10. The electronic volume circuit as claimed in claim 1, wherein the input terminals are connected, through the input resistors and switches of the multi-channel mixing circuit, to the feedback resistor.

11. The electronic volume circuit as claimed in claim 1, wherein a reference voltage is input through the non-inverting terminal of the first operational amplifier.

* * * * *